United States Patent [19]

McDonald

[11] Patent Number: 5,037,772
[45] Date of Patent: Aug. 6, 1991

[54] METHOD FOR FORMING A POLYSILICON TO POLYSILICON CAPACITOR

[75] Inventor: William K. McDonald, Plano, Tex.

[73] Assignee: Texas Instruments Incorporated, Dallas, Tex.

[21] Appl. No.: 450,334

[22] Filed: Dec. 13, 1989

[51] Int. Cl.$^5$ ............................................. H01L 21/70
[52] U.S. Cl. ....................................... 437/52; 437/47; 437/60; 437/191; 437/193; 437/233; 437/235; 437/919; 357/23.6; 357/51
[58] Field of Search ..................... 437/47, 51, 52, 60, 437/191, 193, 195, 225, 228, 220, 233, 235, 919; 357/23.6, 51

[56] References Cited

U.S. PATENT DOCUMENTS 4,403,394  8/1983  Shepard et al. ............... 357/23.6
4,855,801  8/1989  Kuesters ....................... 351/23.6

FOREIGN PATENT DOCUMENTS 0154258  2/1983  Japan .............................. 437/29
0093265  6/1983  Japan ............................ 437/919

Primary Examiner—Brian E. Hearn
Assistant Examiner—Tom Thomas
Attorney, Agent, or Firm—B. Peter Barndt; James T. Comfort; Melvin Sharp

[57] ABSTRACT

A first polysilicon layer (18) is initially deposited onto a layer of field oxide (16). A dielectric (26) is formed on a portion of the first polysilicon layer (18). A second polysilicon layer (28) is deposited over the dielectric (26) and the first polysilicon layer (18). After the selective deposition of a mask (30) on to the second polysilicon layer (28), the polysilicon layers (18, 28) are anistropically etched to form a polysilicon to polysilicon capacitor (34) and a contact (36) of the capacitor (34). The dielectric (26) functions as an insulator for the capacitor (34) and as a barrier during anisotropic etching for protecting the underlying polysilicon layer (18).

17 Claims, 3 Drawing Sheets

METHOD FOR FORMING A POLYSILICON TO POLYSILICON CAPACITOR

TECHNICAL FIELD OF THE INVENTION

This invention relates in general to integrated electronic devices and methods of fabrication thereof. More particularly, the present invention relates to a method for forming a polysilicon to polysilicon capacitor and an apparatus formed therefrom.

BACKGROUND OF THE INVENTION

CMOS and BiCMOS are rapidly evolving as the premiere technology for integrating highly complex analog-digital subsystems on a single chip. Such single chip subsystems require precision capacitors. Polysilicon to polysilicon capacitors have been increasingly used to provide this necessary precision.

In prior art devices, several double level polysilicon (DLP) processes have often been developed to form the polysilicon to polysilicon capacitors. In particular, the LinEPIC DLP process uses a two-mask approach to define a capacitor bottom plate. The first polysilicon layer is masked and etched separate from the second polysilicon layer. Due to the separate masking and etching steps, this process has been considerably complicated and time consuming. Additionally, the topography that is associated with this DLP process requires an additional step of planarization prior to depositing metal on the appropriate contact points.

A second process known as the 4/3 Linear process uses a single mask approach to define a capacitor bottom plate. The first level of polysilicon serves as both the bottom plate and the CMOS gate. After the interlevel dielectric is formed, the second polysilicon layer is deposited to form the capacitor top plate. In order to eliminate filaments from the bottom plate edges and the CMOS gate edges, a large overetch is required. If there is a negative slope on the bottom plate edge, filaments will be trapped under the bottom plate edge. Since this is a DLP process, the added topography also requires additional planarization prior to metalization.

Therefore, a need has arisen for a simplified method of fabricating polysilicon to polysilicon capacitors used on CMOS and BiCMOS. Additionally, it would be an advantageous to reduce the complications and expenses associated with DLP processes. There is also a need to eliminate filaments from the bottom plate edges and CMOS gate edges without requirement of a large overetch which may cause system failure. Finally, there is a need to eliminate the step of planarization prior to applying metal to the appropriate contacts.

SUMMARY OF THE INVENTION

The present invention provides a method for forming a polysilicon to polysilicon capacitor used in CMOS and BiCMOS devices and apparatus formed therefrom. One aspect of the present invention is a method for forming the CMOS. Initially, a layer of field oxide is formed over a substrate. This field oxide layer has a gate formed therein for the future CMOS transistor of the device. A first layer of polysilicon is deposited onto the field oxide at a thickness of approximately 2,000 angstroms. After the first polysilicon layer has been deposited, the temperature of the system is increased to approximately 900 degrees Centigrade (° C.) which forms a thin layer of oxide over the entire polysilicon layer. A layer of silicon nitride is then deposited over the layer of oxide, and a first photoresist layer is selectively deposited onto the silicon nitride layer. After the photoresist layer has been deposited, the exposed surfaces are etched to form an interlevel dielectric from the oxide and nitride layers formed thereon. After the first photoresist layer has been removed, a second polysilicon layer is deposited over the dielectric and the first polysilicon layer. A second photoresist layer is selectively deposited over the polysilicon layer such that when anisotropically etched the exposed surfaces are removed to form a polysilicon to polysilicon capacitor, a CMOS transistor, and a bottom plate contact for the capacitor.

In accordance with the present invention, the interlevel dielectric functions as an insulator when used with the capacitor, and as a barrier to protect the underlying polysilicon layer during anisotropic etching. By using the interlevel dielectric as an insulator and barrier, the present invention eliminates one series of steps of masking and etching. The elimination of this series of processing steps also reduces the topography discrepancies and requirement to planarize prior to deposition of metals within the contacts.

The present invention discloses an apparatus which has a polysilicon to polysilicon capacitor connected thereto. Initially, the polysilicon layer is deposited on a substrate. The interlevel dielectric is formed on a portion of the first polysilicon layer. The second polysilicon layer is formed on the first polysilicon layer and the dielectric such that a capacitor and a contact for the capacitor are created.

The present invention presents technical advantages over the prior method of fabricating a polysilicon to polysilicon capacitor used in both a CMOS and a BICMOS. This novel invention has a dielectric layer used as a barrier to protect the underlying polysilicon, and as an insulator for the polysilicon to polysilicon capacitor. It also has the technical advantage of reducing the processing steps associated with fabricating a polysilicon to polysilicon capacitor. Additionally, the present invention is capable of eliminating the planarization step associated with prior art techniques.

BRIEF DESCRIPTION OF THE DRAWINGS

Other aspects of the invention and their advantages may be appreciated with reference to the following Detailed Description taken in conjunction with the appended Drawings in which.

DETAILED DESCRIPTION OF THE INVENTION

Figure 1:
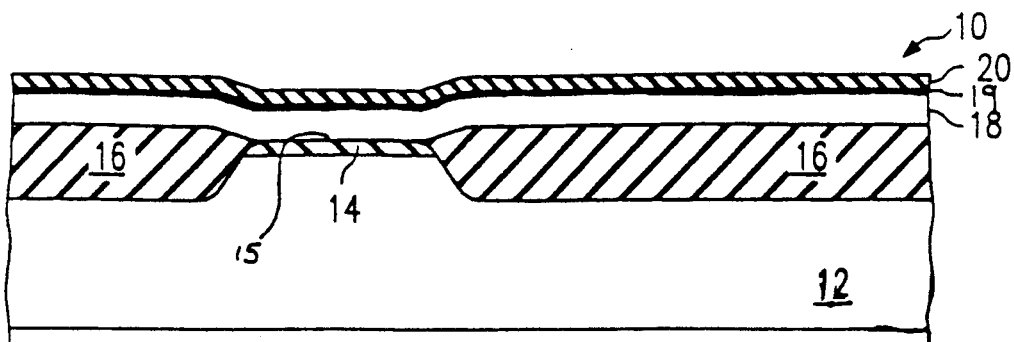
FIG. 1 is an enlarged cross-sectional view of a workpiece illustrating the configuration of a first layer of polysilicon having an oxide and a silicon nitride layer connected thereon.

FIG. 1 is an enlarged cross-sectional view of a workpiece generally designated 10. In its preferred embodiment, workpiece 10 is designed to make a complimentary metal-oxide semiconductor (CMOS). Workpiece 10 generally comprises a substrate 12 which is preferably made of silicon. Substrate 12 is selectively shaped by depositing a photoresist and etching to form a gate region 14.

After the etching process has been performed, an oxide layer 15 is formed over gate region 14, along with a field oxide layer 16 on substrate 12. This oxide isolation formation process is well-known in the art. After field oxide layer 16 has been formed, a first polysilicon layer 18 is formed over field oxide layer 16 and gate region 14. It is preferable that polysilicon layer 18 be deposited to a thickness of approximately 2,000 angstroms. After polysilicon layer 18 has been deposited, an arsenic dopant is implanted into the polysilicon at approximately $1 \times 10^{16}$ atoms per centimeter squared (atoms/cm$^2$). This concentration level requires that there be 85 KeV applied to workpiece 10. After polysilicon layer 18 has been properly doped with an arsenic implant dopant, a thin oxide layer 19 is formed over polysilicon layer 18. This polysilicon oxidation process is performed by increasing the temperature of workpiece 10 to approximately 900° C. for twelve (12) minutes, while workpiece 10 is exposed to a mixture of oxygen and nitrogen. By utilizing these parameters, oxide layer 19 is formed having a thickness of approximately 200 angstroms.

Once polysilicon layer 18 has had oxide layer 19 formed thereon, a silicon nitride layer 20 is evenly deposited over the entire surface of oxide layer 19. This silicon nitride deposition is performed in accordance with methods well-known in the art. It is preferable to form layer 20 approximately 250 angstroms thick.

Figure 2:
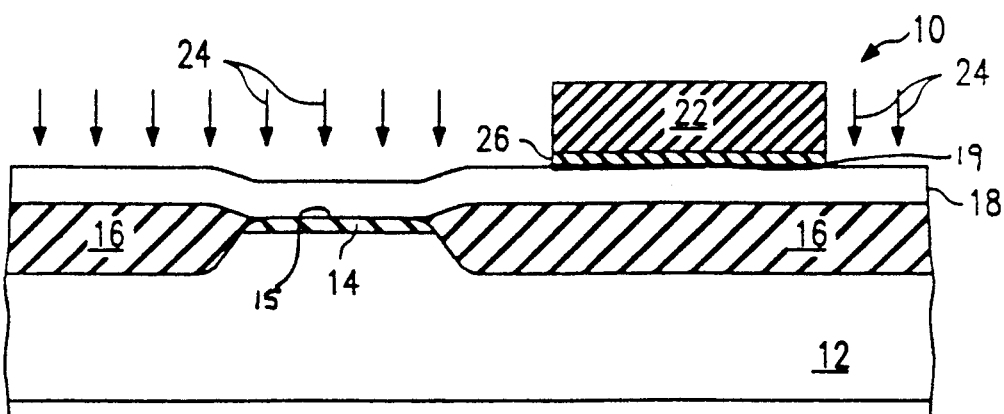
FIG. 2 is an enlarged cross-sectional view of the workpiece as shown in FIG. 1, illustrating the method of forming a dielectric by selectively etching the workpiece.

Referring now to FIG. 2, an enlarged cross-sectional view of workpiece 10, illustrating subsequent steps can be seen. A masking layer or photoresist layer 22 is selectively deposited over layer 20, such that when an etchant 24 is applied to workpiece 10, a dielectric layer 26 formed from layers 19 and 20 is formed under the photoresist 22. In its preferred embodiment, photoresist layer 22 is a Novolak TM composition. Polysilicon layer 18 is not severely damaged by etchant 24 since etchant 24 has a high selectivity to polysilicon. Etchant 24 is a plasma etchant which etches oxide and nitride with high selectivity to polysilicon. After etching, photoresist layer 22 is then removed.

Figure 3:
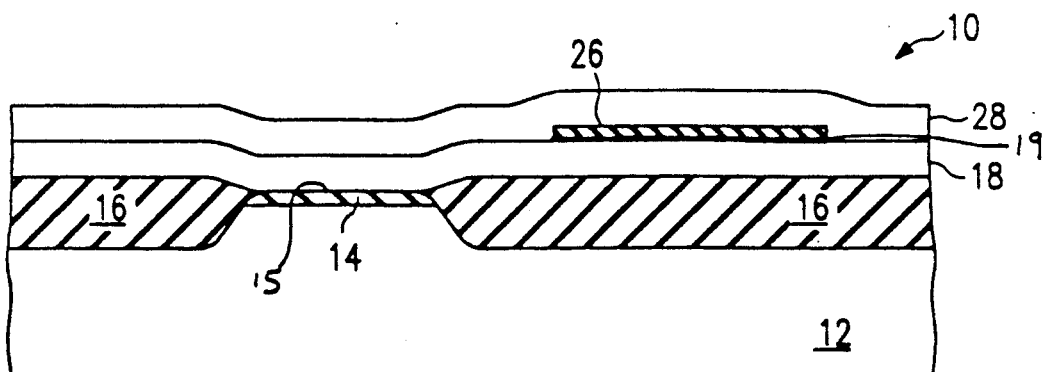
FIG. 3 is an enlarged cross-sectional view of the workpiece as shown in FIG. 2, illustrating a second layer of polysilicon deposited thereon.

FIG. 3 illustrates a second polysilicon layer 28 which has been evenly deposited onto first polysilicon layer 18 and over dielectric layer 26. In its preferred embodiment, the second polysilicon layer 28 is deposited to a thickness of approximately 3,000 angstroms. After second polysilicon layer 28 has been deposited, a dopant is diffused into second polysilicon layer 28. It is preferable that a phosphorous (POCl$_3$) dopant be diffused into second polysilicon layer 28.

Figure 4:
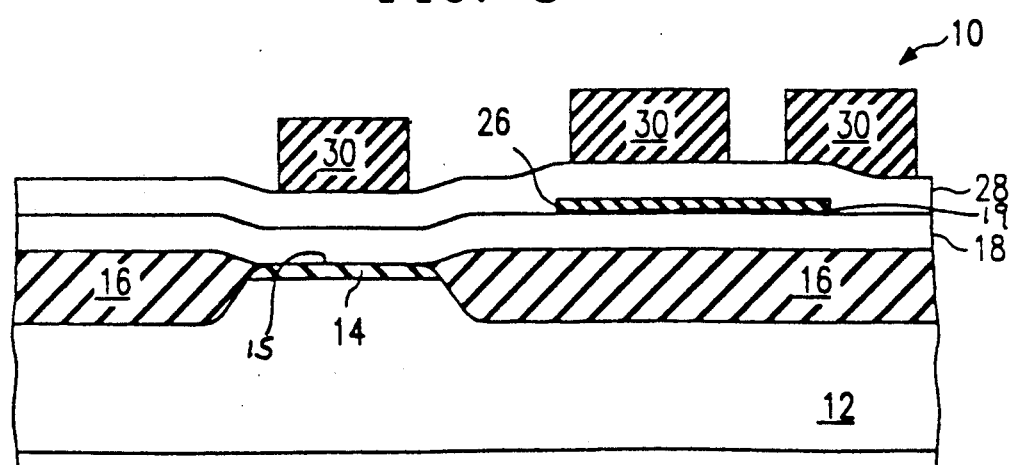
FIG. 4 is an enlarged cross-sectional view of the workpiece as shown in FIG. 3, illustrating the selective deposition of the photoresist prior to etching.

FIG. 4 illustrates the selective masking and depositing of a photoresist layer 30 onto second polysilicon layer 28 such that three separate regions are formed thereon.

Figure 5:
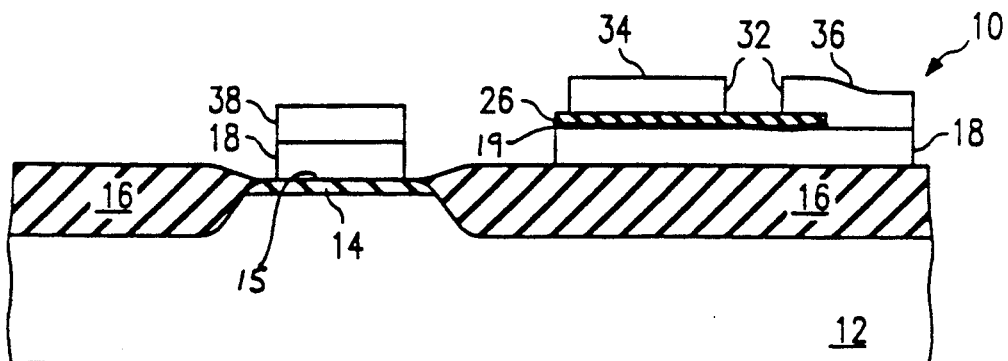
FIG. 5 is an enlarged cross-sectional view of the workpiece as shown in FIG. 4, showing a capacitor, a contact for the capacitor, and a CMOS transistor as formed after etching in accordance with the invention.

Referring now to FIG. 5, a final CMOS product of the present invention can be seen. In accordance with the present invention, an anisotropic etchant, with a selectivity to oxide and nitride of approximately 100 to one, is applied to the structure of FIG. 4 to form the embodiment of the present invention. Once the etchant is applied to workpiece 10, a gap 32 is formed in second polysilicon layer 28 to form a polysilicon to polysilicon capacitor 34 and a contact 36 for the bottom plate of capacitor 34. As can be appreciated, dielectric layer 26, which is exposed at gap 32, functions as an insulator for the polysilicon to polysilicon capacitor 34 and as a barrier to protect the underlying polysilicon layer 18 during anisotropic etching. Also, workpiece 10 has a CMOS transistor 38 formed from layers 15, 18, 28 and gate region 14 in accordance with the present invention.

Figure 6:
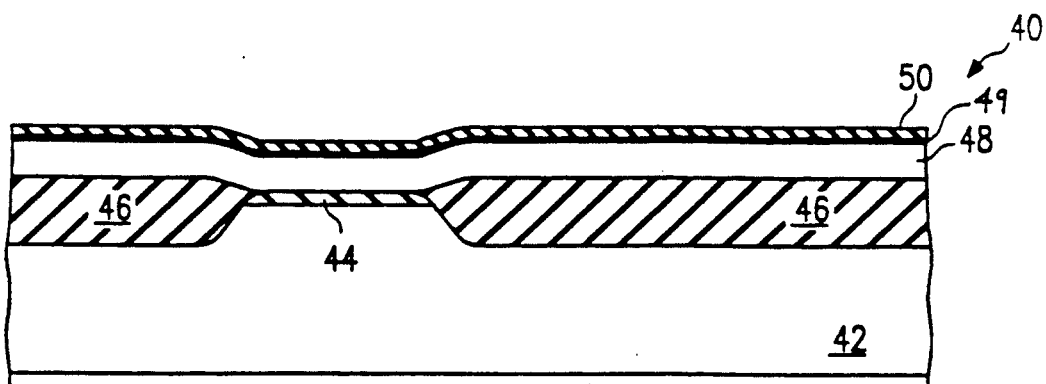
FIG. 6 is an enlarged cross-sectional view of the workpiece, illustrating the configuration of a first layer of polysilicon having an oxide and a silicon nitride layer connected thereon.

Referring now to FIG. 6, a workpiece 40 is illustrated which will create a BiCMOS structure. Initially, the method of fabricating is quite similar to the steps shown in FIGS. 1-2. A substrate 42 has a field oxide layer 46 formed thereon. Formed in the space between field oxide layer 46 is a gate region 44 over which a thin layer of oxide is formed. A first polysilicon layer 48 is formed over field oxide layer 46 and gate region 44. After polysilicon layer 48 is deposited, an arsenic dopant is implanted into polysilicon 48 at a concentration of approximately $1 \times 10^{16}$ atoms/cm$^2$. After the implantation of the arsenic into the polysilicon, an oxidation layer 49 is formed over the polysilicon by increasing the temperature of workpiece 40 to approximately 900° C. for twelve (12) minutes. This oxidation step is performed by exposing workpiece 40 to a mixture of oxygen and nitrogen and the resultant thickness is approximately 200 angstroms. After polysilicon layer 48 has been thermally treated, a silicon nitride layer 50 is deposited to approximately 250 angstroms.

Figure 7:
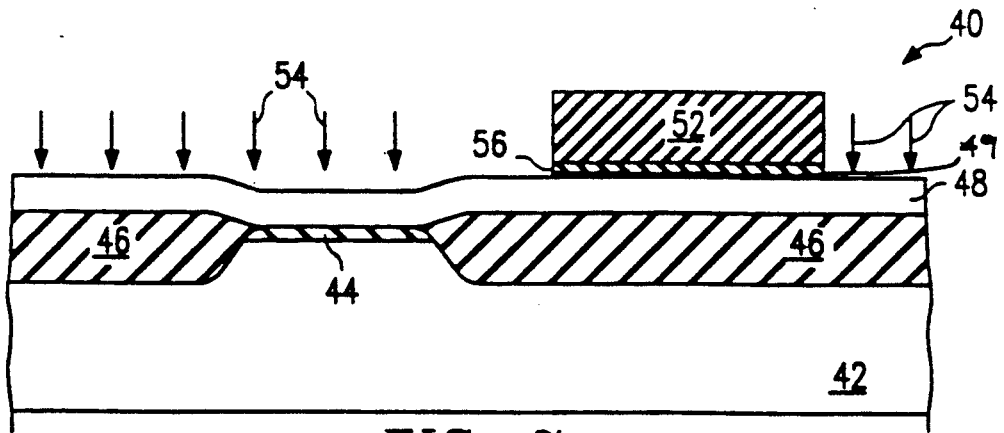
FIG. 7 is an enlarged cross-sectional view of the workpiece as shown in FIG. 6, illustrating the method of forming a dielectric by selectively etching the workpiece.

FIG. 7 illustrates the patterning and etching of workpiece 40 which creates a dielectric 56 from layers 49 and 50. Dielectric 56 is formed by having a photoresist 52 selectively deposited onto the exposed surface. After photoresist 52 has been deposited, an appropriate etchant 54 is applied to workpiece 40 which etches oxide and nitride with high selectivity to polysilicon. Photoresist 52 is then removed.

Figure 8:
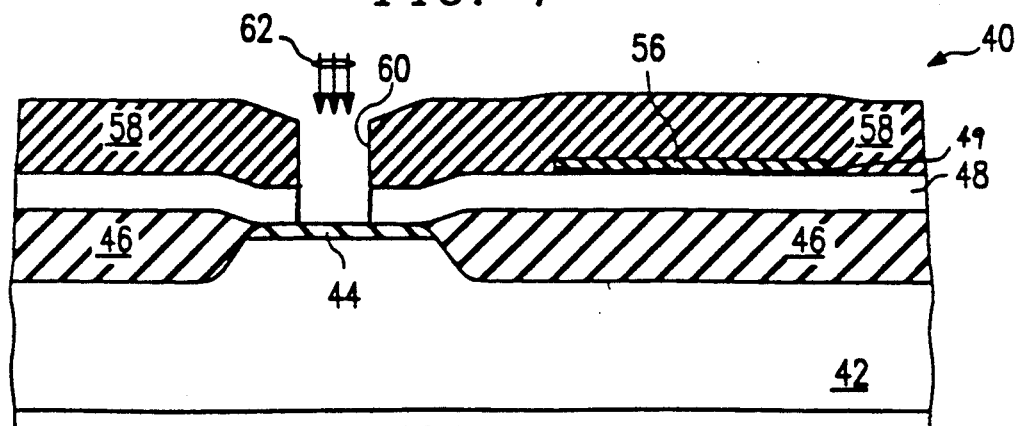
FIG. 8 is an enlarged cross-sectional view of the workpiece as shown in FIG. 7, showing the selective deposition of a photoresist which forms a via therein.

FIG. 8 shows a photoresist layer 58 deposited over polysilicon layer 48 and dielectric 56. Once photoresist 58 has been deposited and patterned, an etchant 62 is applied to workpiece 40 to form a continuous via 60 through polysilicon layer 48 and which exposes gate region 44. Gate region 44 acts as the future emitter contact for the present invention.

Figure 9:
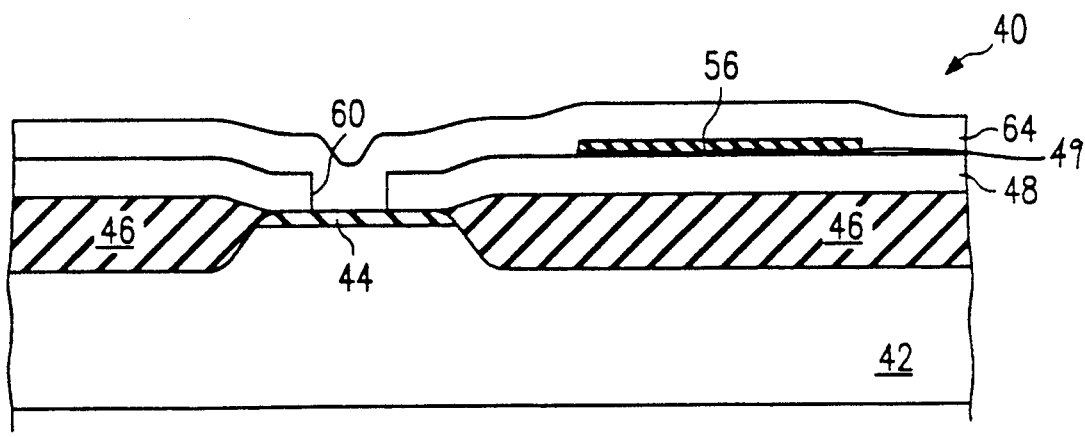
FIG. 9 is an enlarged cross-sectional view of the workpiece as shown in FIG. 8, illustrating a second polysilicon layer formed thereon.

Referring now to FIG. 9, workpiece 40 is shown with a second polysilicon layer 64 deposited over workpiece 40 and into contact with gate region 44 through via 60. It is preferable to have polysilicon layer 64 deposited to a thickness of approximately 3,000 angstroms. Once polysilicon layer 64 has been deposited, a phosphorous implant dopant is applied.

Figure 10:
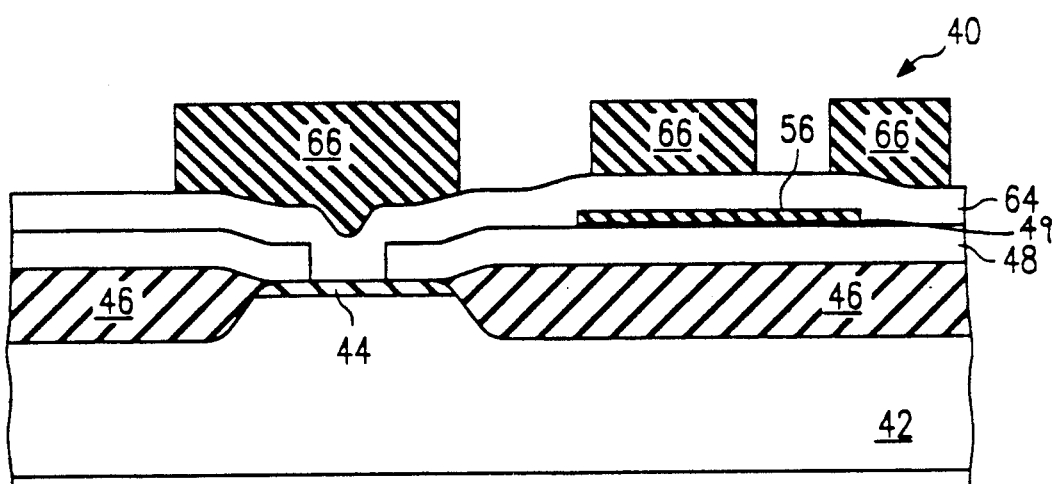
FIG. 10 is an enlarged cross-sectional view of the workpiece as shown in FIG. 9, illustrating the selective deposition of the photoresist prior to etching.

Referring to FIG. 10, the selective deposition of three areas a photoresist layer 66 can be seen. These regions will be subsequently used to define portions of the BiCMOS device.

Figure 11:
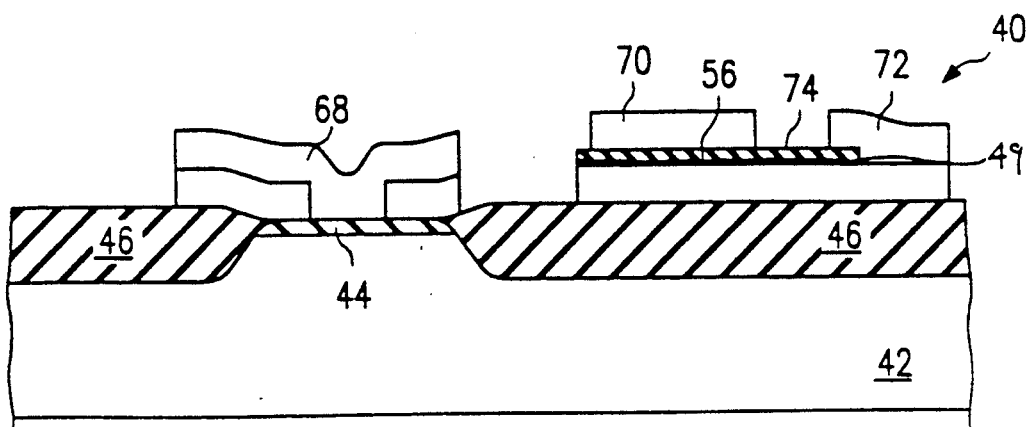
FIG. 11 is an enlarged cross-sectional view of the workpiece as shown in FIG. 10, showing the formation of a capacitor, a contact of the capacitor, and an npn junction as formed in accordance with the present invention.

Referring to FIG. 11, the BiCMOS device formed in accordance with the present invention can be seen. This device is shown after an appropriate etchant is applied to workpiece 40 and the photoresist layers 66 are removed. This etchant is preferably an anisotropic etchant which is highly selective to silicon oxide and silicon nitride, and is preferably approximately 100 to 1 in its selectivity. The present invention is shown with a polysilicon to polysilicon capacitor 70 which is separated from a contact 72 by a gap 74. This gap 74 is the exposed region of dielectric 56. In accordance with the present invention, dielectric 56 functions as a barrier during anisotropic etching to protect polysilicon 48 layer thereunder, and as an insulator for capacitor 70. Also, in accordance with the present invention, a npn transistor 68 is formed over gate region 44.

The present invention presents technical advantages over the prior art. Before the present invention, double level polysilicon (DLP) processes were used to make polysilicon to polysilicon capacitors. In particular, the LinEPIC DLP process used a two-mask approach to define a capacitor bottom plate. Initially, the first mask was used to etch a frame around the bottom plate without removing the polysilicon diffusion area. A sidewall oxide deposition and etch followed to form a slope surface at the edge of the bottom plate. The purpose of the sidewall oxide was to help prevent polysilicon filament formation when the top plate was defined. After the interlevel dielectric was formed, a second mask was used to protect the bottom plate, while allowing the interlevel and first polysilicon to be removed from all other areas. The second polysilicon deposition, patterning, and etching formed the capacitor top plate and CMOS gates. While this approach helped eliminate polysilicon filaments, it is considerably more complicated and expensive than the present invention. Additionally, a second deposition patterning and etching step is necessary when using this invention. Additionally, since this is a DLP process, the topography problems associated with it require planarization of the entire surface prior to metalizing the contacts.

A second DLP process, the 4/3 linear process, used a single mask approach to define a capacitor bottom plate. The first level of the polysilicon served as both the bottom plate and CMOS gates. After the interlevel dielectric formation, a second polysilicon was deposited, patterned, and etched to form the capacitor top plate. To eliminate filaments from the bottom plate edges and CMOS gate edges, a large overetch was used. If there was a negative slope on the bottom plate edge, filaments may become trapped. Also, since this was a DLP process, the added topography requires additional planarization prior to metalization.

In accordance with the present invention, there is disclosed an improved method for fabricating polysilicon to polysilicon capacitors used for CMOS and BiCMOS devices. This method of manufacturing reduces the steps for manufacturing such devices and minimizes required planarization prior to metalizing the surface of the workpiece.

While the preferred embodiment of the present invention and its advantages have been disclosed in the above Detailed Description, the present invention is not limited thereto, but only by the spirit and scope of its appended claims.

What I claimed is:

1. A method for forming a polysilicon to polysilicon capacitor comprising the steps of:
   depositing a first polysilicon layer on an underlying layer;
   forming a dielectric on a portion of said first polysilicon layer;
   depositing a second polysilicon layer onto said dielectric and into said first polysilicon layer; and
   etching said second and said first polysilicon layers to form the capacitor.

2. The method as recited in claim 1, further comprising the step of patterning a photoresist layer onto said second polysilicon such that said dielectric functions as a barrier layer for said underlying first polysilicon layer when etched.

3. The method as recited in claim 1, wherein said step of forming said dielectric layer comprises the step of depositing a silicon nitride layer onto an oxide layer formed on said first polysilicon layer.

4. The method as recited in claim 1, wherein said step of etching further comprises the step of:
   patterning the photoresist layer over said second polysilicon layer; and
   anisotropically etching exposed polysilicon layers.

5. The method as recited in claim 1, wherein said underlying layer is formed by growing a field oxide regions onto a silicon substrate.

6. The method as recited in claim 5, further comprising the step of forming a gate region within said field oxide regions.

7. A method for forming a semiconductor device having a polysilicon to polysilicon capacitor contained therein, which comprises the steps of:
   forming a field oxide layer onto a substrate having a gate region formed therein;
   depositing a first polysilicon layer on said oxide layer;
   forming an oxide layer on said first polysilicon layer;
   depositing a silicon nitride layer on said oxide layer;
   etching surfaces of said silicon nitride layer to form an interlevel dielectric on said first polysilicon layer;
   depositing a second layer of polysilicon onto said dielectric and onto said first polysilicon layer; and
   anisotropically etching surfaces of said second polysilicon layer to selectively remove portions of said first polysilicon layer and said second polysilicon layers to form the capacitor.

8. The method as recited in claim 7, further comprising the step of implanting an arsenic dopant into said first polysilicon layer.

9. The method as recited in claim 7, wherein said step of depositing said first polysilicon layer forms a layer having a thickness of approximately 2,000 angstroms.

10. The method as recited in claim 7, wherein said step of forming said oxide layer comprises heating said first layer of polysilicon at approximately 900 degrees Centigrade (° C.) for approximately 12 minutes.

11. The process as recited in claim 7, further comprising the step of diffusing a phosphorous dopant into said second polysilicon layer.

12. The method as recited in claim 7, wherein said step of depositing said second polysilicon layer forms a layer having a thickness of approximately 3,000 angstroms.

13. The method as recited in claim 7, further comprises the steps of:
   patterning to expose said gate region after said second polysilicon layer is deposited; and
   patterning to expose a first portion of said interlevel dielectric such that a second portion of said dielectric is unexposed; and
   depositing said second layer of photoresist.

14. The method as recited in claim 13, wherein said step of etching removes the exposed polysilicon layers except said first polysilicon layer covered by said second portion of said dielectric.

15. The method as recited in claim 7, further comprising the steps of:
   depositing a masking layer onto said dielectric and said first polysilicon layer after the step of removing said first masking layer; and
   etching said first polysilicon layer to expose said gate region.

16. The method as recited in claim 15, further comprises the steps of:
   patterning to expose said gate region after said first silicon layer is etched;
   patterning to expose a first portion of said interlevel dielectric such that a second portion of said dielectric is unexposed; and
   depositing said photoresist layer.

17. The method as recited in claim 16, wherein said step of etching removes the exposed polysilicon layers, except said first polysilicon layer covered by said second portion of said dielectric.

* * * * *